United States Patent [19]

Dixon et al.

[11] Patent Number: 5,066,424
[45] Date of Patent: Nov. 19, 1991

[54] COMPOSITE MATERIAL FOR EMI/EMP HARDENING PROTECTION IN MARINE ENVIRONMENTS

[75] Inventors: David S. Dixon, Old Lyme, Conn.; James V. Masi, Wilbraham, Mass.

[73] Assignee: The United States of America as represented by the Secretary of the Navy, Washington, D.C.

[21] Appl. No.: 544,297

[22] Filed: Jun. 20, 1990

[51] Int. Cl.$^5$ .............................................. H01B 1/20
[52] U.S. Cl. ................................... 252/518; 252/513; 523/137; 524/430; 524/440
[58] Field of Search ................. 252/513, 518; 523/137; 524/440, 430

[56] References Cited

U.S. PATENT DOCUMENTS

| | | | |
|---|---|---|---|
| 4,665,129 | 5/1987 | Naarmann et al. | 252/500 |
| 4,680,236 | 7/1987 | Myers et al. | 252/519 |
| 4,765,928 | 8/1988 | Thakur | 252/512 |
| 4,824,871 | 4/1989 | Shinomura | 252/511 |
| 4,926,007 | 5/1990 | Aufderheide et al. | 156/47 |
| 4,960,818 | 10/1990 | Reilly et al. | 252/513 |
| 4,963,291 | 10/1990 | Bercaw | 252/513 |

Primary Examiner—Josephine Barr
Assistant Examiner—Bradley A. Swope
Attorney, Agent, or Firm—Michael J. McGowan; Prithvi C. Lall; Michael F. Oglo

[57] ABSTRACT

Composite material composed of conducting and semiconducting oxide particles, fibers, or flakes suspended in a of polymeric material matrix for use in connectors, junction boxes, enclosures or similar electromagnetic shielding applications. The use of a composite material with electromagnetic shielding properties built into the material itself, combined with the use of a semi-conductive filler that minimizes the corrosive effect of an electrochemical potential difference, provides EM shielding and corrosion resistance for these materials when they are used in marine and aircraft environments. Oxide semiconductor materials and compatible conductive fillers also provides a basis for a new class of EMI and EMP composite materials that exhibit a stable current-controlled and voltage-controlled negative resistance (VCNR, CCNR) characteristic. Testing has shown that the conductivities of these materials increase as the field and/or the voltage increases. This characteristic is desirable, providing inherent protection of electronic circuits from voltages or currents. This VCNR/CCNR effect is dependent upon the voltages, the degree of filler material combinations and the filler loading which will determine the composite materials properties.

8 Claims, 1 Drawing Sheet

COMPOSITE MATERIAL FOR EMI/EMP HARDENING PROTECTION IN MARINE ENVIRONMENTS

STATEMENT OF GOVERNMENT INTEREST

The invention described herein may be manufactured and used by or for the Government of the United States of America for governmental purposes without the payment of any royalties thereon or therefor.

This patent application is co-pending with related patent application entitled "Method for Providing EMI/EMP Hardening and Breakdown Protection in Composite Materials" by the same inventors filed on the same date as this application.

BACKGROUND OF THE INVENTION (1) Field of the Invention

The present invention relates to conductive composite materials and more particularly to composite materials for shielding against the effects of EMI/EMP in corrosive marine environments.

(2) Description of the Prior Art

It is well known that existing methods of improving the electromagnetic interference (EMI) and electromagnetic pulse (EMP) performance of lightweight non-corrosive, non-metallic materials, so often used in today's commercial and military enclosures, have typically utilized coatings, platings and/or separate metallic layers. Coatings and platings on present nonmetallic materials have not provided acceptable solutions in the areas of material adhesion, adequate shielding effectiveness and material electrochemical compatibility when interfaced with other materials. Hybrid connectors consisting of independent metal and plastic layers may provide a measure of EMI/EMP performance. This approach, however, incurs increased material/connector complexity and weight.

SUMMARY OF THE INVENTION

Accordingly, it is a general purpose and object of the present invention to provide a conductive composite material for use as an electromagnetic shield.

It is a further object that such material be lightweight.

Another object is that such material exhibit a high level of corrosion resistance in a marine environment.

Still another object is that such material be easily formed and machined into electrical enclosures.

These objects are accomplished with the present invention by providing composite materials comprising conducting and semi-conducting particles, fibers, or flakes in a matrix of polymeric or ceramic material for use in connectors, junction boxes, enclosures or similar electromagnetic shielding applications. The use of a composite material with electromagnetic shielding properties built into the material itself, combined with the use of a semi-conductive filler that minimizes the corrosive effect of electrochemical potential differences, provides EMI/EMP shielding and corrosion resistance in these materials when they are used in the presence of marine and aircraft environments. Oxide semiconductor materials and compatible conductive fillers provide a new class of EMI/EMP composite materials that exhibit a stable current-controlled and voltage-controlled negative resistance (VCNR/CCNR) characteristic. Testing has shown that the conductivities of these materials increase as the field and/or the voltage increases. This characteristic is desirable to provide inherent protection of electronic circuits from voltages or currents. The VCNR/CCNR effect is dependent upon the voltages, the degree of filler material combinations and the filler loading which will determine the composite materials properties.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings wherein.

DESCRIPTION OF THE PREFERRED EMBODIMENT

Figure 1:
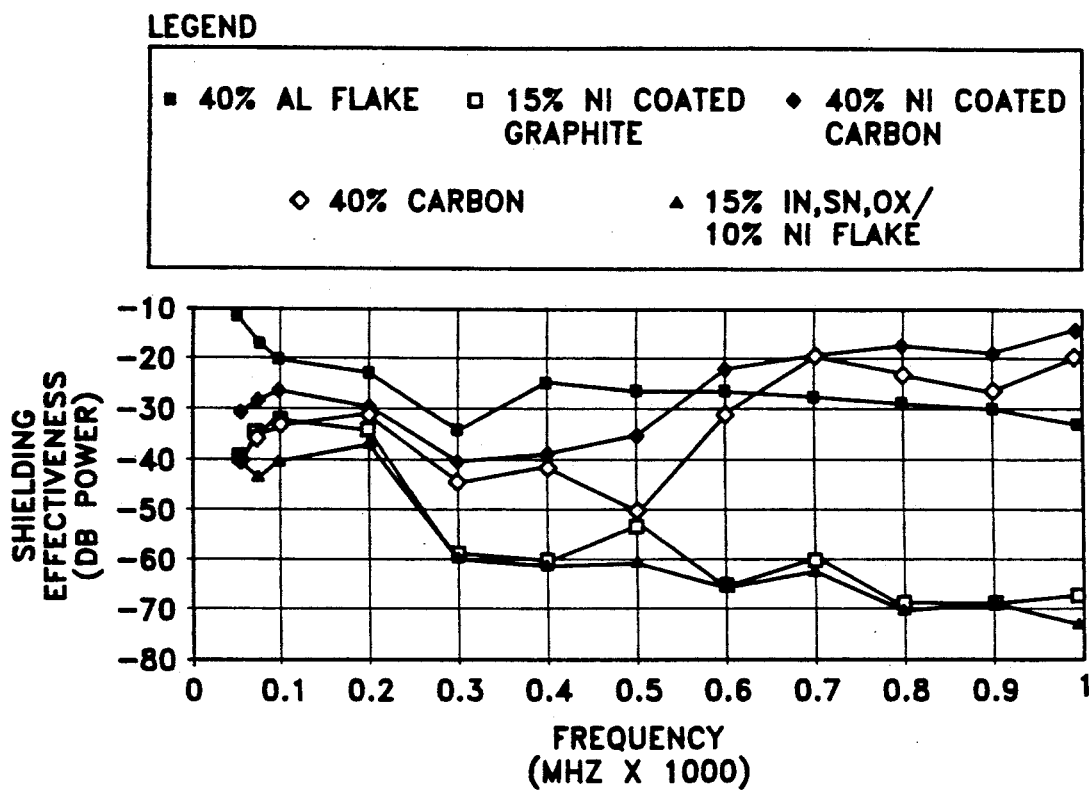
FIG. 1 shows the electromagnetic shielding effectiveness (S.E.) of various composite materials based on tests using the ASTM testing method.

FIG. 1 illustrates the electromagnetic shielding effectiveness (S.E.) of various composite materials using the ASTM testing method. This method evaluated the near field S.E. of a material. This figure indicates that the 15%ITO/10%Ni-Flake S.E. is as good as a 40% loading of Ni-coated graphite, however unlike the Ni-coated graphite the ITO/Ni-Flake composite also protects against corrosion caused by electrochemical potential differences by rapidly reducing the electrochemical potential difference (ECPD) between dissimilar materials. Note that ITO refers to Indium Tin Oxide.

Figure 2:
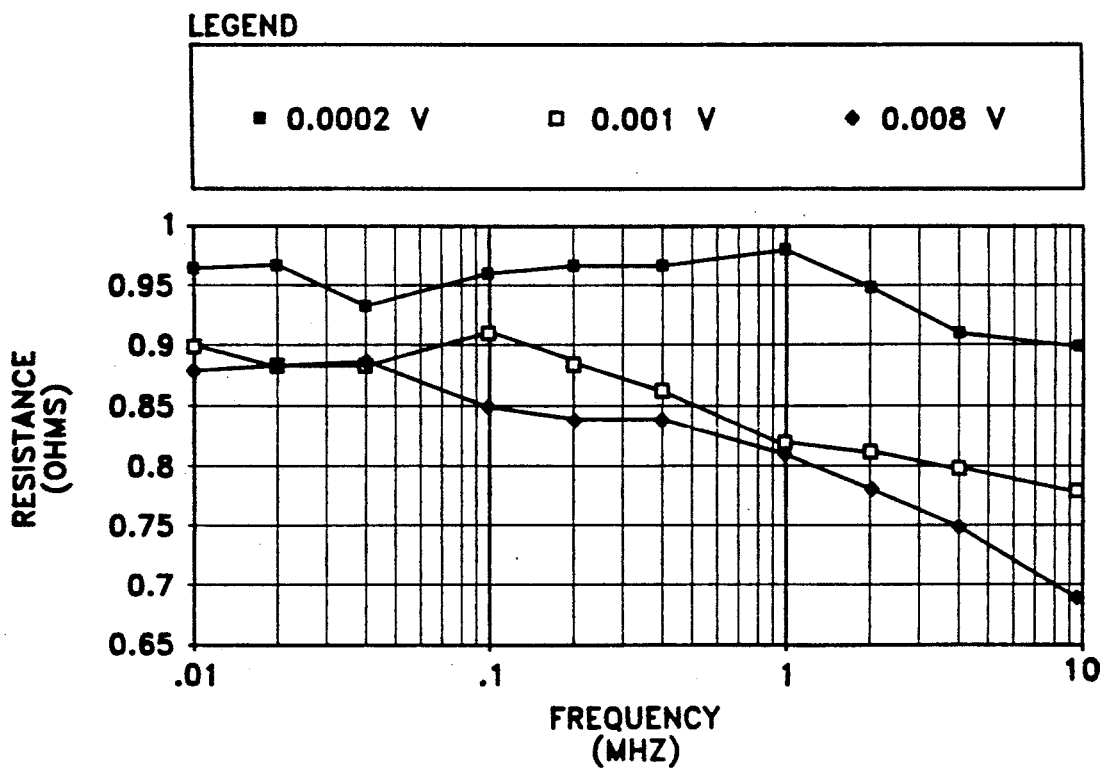
FIG. 2 shows the VCNR/CCNR effect that is occurring in samples of the composite appropriately doped with semiconductive filler.

FIG. 2 illustrates the VCNR/CCNR effect that is occurring in samples of the composite appropriately doped with semiconductive filler. In this sample the 15%ITO/10% Ni-Flake composites resistance decreased from 0.95 Ohms to less than 0.7 Ohms as the applied voltage was increased from 0.2 millivolts to 8 millivolts over a frequency range from 10 kHz to 10 MHz.

The composite material is comprised of a filler/resin combination wherein the filler is molded into the resin. One of the more desirable (but not limited to) resins utilized is polyether etherketone (PEEK) because of its good moldability, good to excellent machinability, its good continuous use temperature (exceeds 220 degrees Celsius when loaded) and its resistance to chemicals and to thermal and mechanical shock. Studies are also being conducted using Polyetherimide (PEI) and polycarbonate as other possible resins for the composite material. The filler used in the composite material comprises two elements: (1) Nickel flakes were chosen as a filler material because of a minimum resistivity that serves to establish the shielding effectiveness of the composite material while at the same time maintaining the corrosion resistance properties that are being supplied by the ITO. (2) ITO was used in combination with the metallic filler, such as nickel (Ni) flakes, as a filler because of the property of certain oxides and other catalytic-behaving material to "self-adjust" their electrochemical EMF's. This is done either by oxygen manipulation or other charge transfer, thereby making them extremely attractive in minimizing corrosion due to the dissimilar galvanic potentials. These semiconductors such as Indium Tin Oxide or Indium Oxide, or Tin Oxide also increase the conductivity of the composite thereby increasing its EM shielding effectiveness.

The preferred embodiment of the composite material of the present invention includes three options. One of these includes ITO/Nickel Flake in a PEEK polymer matrix. The second includes ITO/Nickel Flake with inherently conductive plastic as a minority addition in a polycarbonate polymer matrix. The third involves the use of ITO/Nickel Flake in the polycarbonate matrix. Percentages for the preferred embodiment for the Nickel are from 0% to 10% and for the ITO are from 5% to 15%. The test samples were prepared as follows:

For the case of the ITO/Nickel Flake in PEEK the 15 weight-percent (w/%) ITO powder (10%SnO$_2$/90%In$_2$O$_3$, from Indium Corporation of America) was blended with 10 w/% Nickel Flake (from Novamet, International Nickel Corp.) and further blended into a PEEK polymer (from ICI America). The resulting mixture was extruded at a temperature in excess of 250 degrees Celsius. This extruded material was then granulated and used as feeder stock for injection molding at temperatures in excess of 165 degrees Celsius.

In the case of the ITO/Nickel Flake/Intr. conductive polymer in polycarbonate the same percentages of ITO and Ni Flake described above were also blended into a Polycarbonate material (from Buehler, Ltd., General Electric) that also had 10 w/% intrinsically conducting polymer (ICP 117 from Polaroid Corp.) added. This blend was compression molded at 180 degrees Celsius and 200 p.s.i. into a test sample.

In the case of the ITO/Nickel Flake in polycarbonate the same percentages of ITO and Ni Flake as above were blended as above in polycarbonate and were compression molded as above but without the intrinsically conducting polymer.

The composite material is designed to satisfy a full range of electromagnetic, chemical and mechanical properties, including corrosion resistance to hostile environments, with emphasis placed on electrochemical compatibility with connecting enclosures of aluminum.

The mechanical properties of a composite depend upon the relative proportions of resin and filler, and the size, shape, state of aggregation or agglomeration, relative dispersion, and orientation of filler. Further, the level of interphase adhesion affects ultimate strength and elongation of the material and provides a measure of the unwanted condition known as "pull away". For example, for fibers with a circular or square cross-section a simplified method for predicting the tensile and transverse modulus of elasticity for a composite is to employ the Halpin-Tsai equations, i.e.,
Tensile:

$$E_c(ten.) = V_f E_f + V_m E_m, \quad (1)$$

and
Transverse:

$$E_c(tran.) = [(1+2nV_f)/(1-nV_f)]E_m \quad (2)$$

where $n = [(E_f/E_m)-1]/[(E_f/E_m)+2]$, $E_c$ is the modulus of the composite, $E_f$ and $E_m$ are the moduli of the filler and the matrix, respectively, and $V_f$ and are the volume fractions of the filler and matrix, respectively. Equations (1) and (2) represent the basis upon which the mechanical properties of the desired composite are predicted.

There are a number of prior art theoretical models which conditionally predicted the electrical properties of composites. These models were based upon the hopping model taught in Mott, N. F., Adv. Phys. (Philos. Mag. Suppl.), 16:49 (1967), the percolation theory taught in McCullough, R.L., Composites Science and Technology, 22:3 (1985), the critical loading approach tau in Bhattacharya, S.K., "Metal Filled Polymers: Properties and Applications", Marcel Dekker, N.Y., 1986.pp. 170, ff, or upon simple RC networks such as taught in Sichel, E. K., "Carbon Black - Polymer Composites", Marcel Dekker, N.Y., 1982.pp. 152,ff.

The present invention establishes a verifiable model which predicts the electromagnetic properties of a composite when provided with a set of specific component material parameter inputs. The total impedance Z(total) of a three dimensional distributed network of equivalent impedances Z(equiv.) can be shown to be, $$Z(total) = mZ(equiv.)/16 \quad (3)$$

where:
m is the aspect ratio of length to width of a particular test specimen and Z(equiv.) is the equivalent impedance of the particle/matrix combination. The equivalent impedance Z(equiv.) is calculated based upon the schematic of the resistor, capacitor, and inductor circuit shown in FIG. 1.

Using the filler model which relates the resistivity o the filler material to that of the composite via the volume fraction of the filler, the resistivity of the combination can be calculated, theoretically, for these small interparticle dimensions.

$$\rho = (V_f/3)[1/(1 - (\sqrt[3]{V_f})/3)]\rho_o \quad (4)$$

Using form factors for the particle, flake, or fiber, and combining this with a three-dimensional polymer matrix, leads to a solvable set of equations involving resistors, capacitors, and inductors at various frequencies and fields. The model needs inputs with respect to the electric field and the frequency dependence of the resistive and reactive elements, i.e. $R(E,\omega)$ and $X(E,\omega)$.

A composite sample under an applied field has its potential distribution curves bent more drastically over the conducting filler contacts due to space charge. For purposes of simplicity, the particle/flake/fiber is assumed to have smooth contours and the polymer matrix is electrically homogeneous and isotropic. A number of researchers have noted that current controlled negative resistance (CCNR) is observed (voltage dependent threshold initiation) Pike, J. N., Private Communication, UCRI 618 (1970), p. 155. Local heating of the matrix/conductive filler is deemed to be the cause, the result being quasi-filamentary conduction. This implies that, as the voltage (field) increases across such a composite element, the conductivity and, as a result the shielding effectiveness, increases. This effect is enhanced by certain fillers, such as semiconductive oxides which themselves exhibit CCNR or voltage controlled negative resistance (VCNR).

According to the electrical model shown (ignoring for now the aforementioned inductive component which is negligible for frequencies under 50 MHz), the equivalent $R_o/R(E,\omega)/C(E,\omega)$ circuit impedance decreases with increasing frequency. This, combined with CCNR or VCNR, indicates that the composite with semiconducting particles, flakes, or fibers (or combinations thereof) is an improved shield, not only for EMI, but also for EMP applications. The electromagnetic properties are predicted by the model set forth in our co-pending patent application.

The resistivity of the composite material ranges between $1 \times 10^{-3}$ and $1 \times 10^{-5}$ Ohm/cm. This places it at the higher end of the metal resistivity spectrum but below the resistivity characteristics of typical carbon powders and fibers so often used in composites. FIG. (1) shows that the shielding effectiveness of the composite material using 15% ITO/10%Ni Flakes compares quite favorably with that of 15% Ni coated graphite with the added benefit of not having an electrochemical corrosion problem or pullaway of Ni from the graphic fibers.

The electrochemical potential of the ITO and ITO/Ni flake fillers were measured in a flowing brine solution versus 5000 series aluminum. The tests revealed that the potential difference for each filler decreased substantially after 15 seconds. Initial electrochemical voltages between aluminum and nickel in a brine solution were around 1.25 volts which decreased to approximately 0.2 Volts after about 15 seconds. FIG. (2) shows that some mixtures of the composite material may also be suitable for use as a breakdown material against electromagnetic pulse surges. This is the VCNR and CCNR effect discussed earlier.

It will be understood that various changes in the details, materials, steps and arrangement of parts, which have been herein described and illustrated in order to explain the nature of the invention, may be made by those skilled in the art within the principle and scope of the invention as expressed in appended claims.

The advantages of the present invention over the prior art are that lightweight, easily formable composite materials may be used in place of metals without suffering the effects of EMI/EMP What has thus been described are composite materials composed of conducting and semi-conducting particles, fibers, or flakes in a matrix of polymeric material for use in connectors, junction boxes, enclosures or similar electromagnetic shielding applications. Only the use of a composite material with electromagnetic (EM) shielding properties built into the material itself, combined with the use of a semi-conductive filler that will minimize the corrosive effect of electrochemical potential differences, will provide a total long-term solution to ensure that EM shielding and corrosion resistance is maintained in these materials when they are used in the presence of marine and aircraft environments.

Oxide semiconductor materials and compatible conductive fillers also provide a basis for a new class of EMI and EMP composite materials that exhibit a stable current-controlled and voltage-controlled negative resistance (VCNR, CCNR) characteristic. Testing has shown that the conductivities of these materials increase as the field and/or the voltage increases. This characteristic is desirable to provide inherent protection of electronic circuits from voltages or currents. This VCNR/CCNR effect is dependent upon the voltages, the degree of filler material combinations and the filler loading which will determine the composite materials properties.

Obviously many modifications and variations of the present invention may become apparent in light of the above teachings.

In light of the above, it is therefore understood that within the scope of the appended claims, the invention may be practiced otherwise than as specifically described.

What is claimed is:

1. A composite material for EMI/EMP hardening protection, comprising:
    a preselected 0.01-10 weight percent of non-conducting, non-corrosive matrix material selected from a group of insulating polymers consisting of a PEEK polymer, a polycarbonate polymer and a polycarbonate polymer with an inherently conductive polypyrrole polymer plastic additive;
    0-10 weight percent of conducting Nickel-flake particles, embedded in said non-conducting matrix;
    5-15 weight percent of non-corrosive semi-conducting oxide particles selected from the group consisting of Indium Tin Oxide, Indium Oxide and Tin Oxide, embedded in said non-conducting matrix and acting in cooperation with said conducting particles in such a way that galvanic potential is lowered;
    said preselected weight percent of matrix material comprising the remainder of said composite material.

2. A composite material according to claim 1 wherein said semi-conducting particles are Indium Tin Oxide powder.

3. A composite material according to claim 2 wherein said matrix material is a PEEK polymer.

4. A composite material according to claim 2 wherein said matrix material is a polycarbonate polymer.

5. A composite material according to claim 2 wherein said matrix material is a polycarbonate polymer with an inherently conductive polypyrrole polymer plastic additive.

6. A composite material according to claim 3 comprising 15 w/% Indium Tin Oxide, 10 w/% Nickel flake and 75 w/% PEEK polymer.

7. A composite material according to claim 4 comprising 15 w/% Indium Tin Oxide, 10 w/% Nickel flake and 75 w/% polycarbonate polymer.

8. A composite material according to claim 5 comprising 15 w/% Indium Tin Oxide, 10 w/% Nickel flake and 73 w/% polycarbonate with 2 w/% inherently conductive polypyrrole polymer.

* * * * *